United States Patent
Herner et al.

(10) Patent No.: US 9,246,089 B2
(45) Date of Patent: Jan. 26, 2016

(54) NONVOLATILE MEMORY CELL WITHOUT A DIELECTRIC ANTIFUSE HAVING HIGH- AND LOW-IMPEDANCE STATES

(71) Applicant: SanDisk 3D LLC, Milpitas, CA (US)

(72) Inventors: Scott Brad Herner, San Jose, CA (US); Andrew Walker, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 7 days.

(21) Appl. No.: 14/145,614

(22) Filed: Dec. 31, 2013

(65) Prior Publication Data

US 2014/0110660 A1 Apr. 24, 2014

Related U.S. Application Data

(60) Division of application No. 10/955,549, filed on Sep. 29, 2004, now Pat. No. 8,637,366, which is a continuation-in-part of application No. 10/855,784, filed on May 26, 2004, now Pat. No. 6,952,030, which is a continuation of application No. 10/326,470, filed on Dec. 19, 2002, now abandoned.

(51) Int. Cl.
*H01L 29/00* (2006.01)
*H01L 45/00* (2006.01)
(Continued)

(52) U.S. Cl.
CPC .............. *H01L 45/1233* (2013.01); *G11C 5/02* (2013.01); *G11C 11/39* (2013.01); *G11C 17/06* (2013.01); *G11C 17/16* (2013.01); *H01L 27/1021* (2013.01); *G11C 2213/71* (2013.01); *G11C 2213/77* (2013.01)

(58) Field of Classification Search
CPC ............ H01L 27/1021; H01L 23/5252; H01L 27/101; H01L 27/0688
USPC ........................... 438/593; 257/313, 314, 315
See application file for complete search history.

(56) References Cited

U.S. PATENT DOCUMENTS 4,499,557 A    2/1985   Holmberg et al.
4,545,111 A    10/1985  Johnson
(Continued)

FOREIGN PATENT DOCUMENTS

WO    WO 2004/061851    7/2004

OTHER PUBLICATIONS

Apr. 30, 2014 Response and Terminal Disclaimer to Jan. 30, 2014 Office Action and in related U.S. Appl. No. 13/773,196.
(Continued)

*Primary Examiner* — Bradley K Smith
*Assistant Examiner* — David Goodwin
(74) *Attorney, Agent, or Firm* — Dugan & Dugan, PC

(57) ABSTRACT

A memory cell according to the present invention comprises a bottom conductor, a doped semiconductor pillar, and a top conductor. The memory cell does not include a dielectric rupture antifuse separating the doped semiconductor pillar from either conductor, or within the semiconductor pillar. The memory cell is formed in a high-impedance state, in which little or no current flows between the conductors on application of a read voltage. Application of a programming voltage programs the cell, converting the memory cell from its initial high-impedance state to a low-impedance state. A monolithic three dimensional memory array of such cells can be formed, comprising multiple memory levels, the levels monolithically formed above one another.

21 Claims, 8 Drawing Sheets

(51) Int. Cl.
| | |
|---|---|
| G11C 5/02 | (2006.01) |
| G11C 11/39 | (2006.01) |
| G11C 17/06 | (2006.01) |
| G11C 17/16 | (2006.01) |
| H01L 27/102 | (2006.01) |

(56) References Cited

U.S. PATENT DOCUMENTS

| | | | |
|---|---|---|---|
| 4,646,266 A | 2/1987 | Ovshinsky et al. | |
| 4,665,428 A | 5/1987 | Hockley et al. | |
| 5,432,729 A | 7/1995 | Carson et al. | |
| 5,441,907 A | 8/1995 | Sung et al. | |
| 5,559,732 A | 9/1996 | Birge | |
| 5,700,737 A | 12/1997 | Yu et al. | |
| 5,745,407 A | 4/1998 | Levy et al. | |
| 5,751,012 A | 5/1998 | Wolstenholme et al. | |
| 5,792,569 A | 8/1998 | Sun et al. | |
| 5,835,396 A | 11/1998 | Zhang | |
| 5,844,297 A | 12/1998 | Crafts et al. | |
| 5,877,538 A | 3/1999 | Williams | |
| 5,915,167 A | 6/1999 | Leedy | |
| 5,991,193 A | 11/1999 | Gallagher et al. | |
| 6,034,882 A | 3/2000 | Johnson et al. | |
| 6,111,784 A | 8/2000 | Nishimura | |
| 6,141,241 A | 10/2000 | Ovshinsky et al. | |
| 6,185,122 B1 | 2/2001 | Johnson et al. | |
| 6,236,587 B1 | 5/2001 | Gudesen et al. | |
| 6,420,215 B1 | 7/2002 | Knall et al. | |
| 6,468,854 B1 | 10/2002 | Agarwal | |
| 6,483,736 B2 | 11/2002 | Johnson et al. | |
| 6,525,953 B1 | 2/2003 | Johnson | |
| 6,534,841 B1 | 3/2003 | Van Brocklin et al. | |
| 6,541,312 B2 * | 4/2003 | Cleeves et al. | 438/131 |
| 6,549,447 B1 * | 4/2003 | Fricke et al. | 365/105 |
| 6,567,301 B2 | 5/2003 | Anthony et al. | |
| 6,584,029 B2 | 6/2003 | Tran et al. | |
| 6,611,453 B2 | 8/2003 | Ning | |
| 6,627,530 B2 | 9/2003 | Li et al. | |
| 6,635,556 B1 | 10/2003 | Herner | |
| 6,657,278 B2 * | 12/2003 | Lee | 257/530 |
| 6,664,639 B2 | 12/2003 | Cleeves et al. | |
| 6,677,220 B2 | 1/2004 | Van Brocklin et al. | |
| 6,689,644 B2 | 2/2004 | Johnson | |
| 6,693,823 B2 | 2/2004 | Brown | |
| 6,784,517 B2 | 8/2004 | Kleveland et al. | |
| 6,815,264 B2 | 11/2004 | Stribley et al. | |
| 6,853,049 B2 | 2/2005 | Herner | |
| 6,879,014 B2 | 4/2005 | Wagner et al. | |
| 6,879,505 B2 | 4/2005 | Scheuerlein | |
| 6,911,233 B2 | 6/2005 | Lin | |
| 6,946,719 B2 | 9/2005 | Petti et al. | |
| 6,951,780 B1 | 10/2005 | Herner | |
| 6,952,030 B2 | 10/2005 | Herner et al. | |
| 6,952,043 B2 | 10/2005 | Vyvoda et al. | |
| 6,984,561 B2 | 1/2006 | Herner et al. | |
| 7,026,212 B2 | 4/2006 | Herner et al. | |
| 7,038,248 B2 * | 5/2006 | Lee | 257/104 |
| 7,115,967 B2 | 10/2006 | Cleeves | |
| 7,172,840 B2 | 2/2007 | Chen | |
| 7,176,064 B2 | 2/2007 | Herner | |
| 7,224,013 B2 | 5/2007 | Herner et al. | |
| 7,238,607 B2 | 7/2007 | Dunton et al. | |
| 7,265,049 B2 | 9/2007 | Herner et al. | |
| 7,285,464 B2 | 10/2007 | Herner et al. | |
| 7,307,013 B2 | 12/2007 | Raghuram et al. | |
| 7,397,101 B1 | 7/2008 | Masini et al. | |
| 7,423,304 B2 | 9/2008 | Cleeves et al. | |
| 7,474,000 B2 | 1/2009 | Scheuerlein | |
| 7,511,352 B2 | 3/2009 | Vyvoda | |
| 7,517,796 B2 | 4/2009 | Raghuram et al. | |
| 7,557,405 B2 | 7/2009 | Herner et al. | |
| 7,560,339 B2 | 7/2009 | Herner et al. | |
| 7,767,499 B2 | 8/2010 | Herner | |
| 2003/0025176 A1 | 2/2003 | Subramanian et al. | |
| 2003/0164491 A1 | 9/2003 | Lee | |
| 2003/0206429 A2 | 11/2003 | Subramanian et al. | |
| 2005/0012119 A1 | 1/2005 | Herner et al. | |
| 2005/0026334 A1 | 2/2005 | Knall | |
| 2005/0052915 A1 | 3/2005 | Herner et al. | |
| 2005/0098800 A1 | 5/2005 | Herner et al. | |
| 2005/0221200 A1 | 10/2005 | Chen | |
| 2005/0226067 A1 | 10/2005 | Herner et al. | |
| 2006/0067117 A1 | 3/2006 | Petti | |
| 2006/0249753 A1 | 11/2006 | Herner et al. | |
| 2009/0261343 A1 | 10/2009 | Herner et al. | |
| 2010/0181657 A1 | 7/2010 | Herner et al. | |
| 2011/0133149 A1 | 6/2011 | Sonehara | |
| 2011/0176352 A1 | 7/2011 | Herner | |
| 2011/0287615 A1 | 11/2011 | Herner | |
| 2011/0318911 A1 | 12/2011 | Herner et al. | |
| 2012/0300533 A1 | 11/2012 | Herner | |
| 2013/0164921 A1 | 6/2013 | Herner et al. | |
| 2013/0286728 A1 | 10/2013 | Herner et al. | |

OTHER PUBLICATIONS

Office Action in related U.S. Appl. No. 13/773,196 mailed Jan. 30, 2014.

Singh, D V., et al., "Abrupt phosphorus profiles in Si: Effects of temperature and substitutional carbon on phosphorus autodoping", Journal of the Electrochemical Society, 150, (2003) G553-G556.

Written Opinion of International Application No. PCT/US2006/022023 mailed Sep. 21, 2006.

International Search Report of International Application No. PCT/US2006/022023 mailed Sep. 21, 2006.

International Preliminary Report on Patentability of International Application No. PCT/US2006/022023 issued Dec. 11, 2007.

Office Action of Europe Application No. 06 760 714.3 mailed Apr. 30, 2008.

Office Action and Search Report of Taiwan Application No. 095120206 issued Jun. 30, 2008.

Office Action of U.S. Appl. No. 10/955,549 mailed Jun. 27, 2006.

Final Office Action of U.S. Appl. No. 10/955,549 mailed Oct. 19, 2006.

Final Office Action of U.S. Appl. No. 10/955,549 mailed Sep. 24, 2007.

Aug. 4, 2006 Reply to Jun. 27, 2006 Office Action of U.S. Appl. No. 10/955,549.

Office Action of U.S. Appl. No. 11/015,824 mailed Dec. 14, 2006.

Notice of Allowance of U.S. Appl. No. 11/015,824 mailed Jun. 14, 2007.

Apr. 12, 2007 Reply to Dec. 14, 2006 Office Action of U.S. Appl. No. 11/015,824.

Office Action of U.S. Appl. No. 11/148,530 mailed Apr. 19, 2007.

Final Office Action of U.S. Appl. No. 11/148.530 mailed Nov. 23, 2007.

Office Action of U.S. Appl. No. 11/148,530 mailed Sep. 29, 2008.

Final Office Action of U.S. Appl. No. 11/148,530 mailed Apr. 30, 2009.

Jul. 30, 2009 Reply to Apr. 30, 2009 Final Office Action of U.S. Appl. No. 11/148,530.

Jan. 29, 2009 Reply to Sep. 29, 2008 Office Action of U.S. Appl. No. 11/148,530.

Aug. 20, 2007 Reply to Apr. 19, 2007 Office Action of U.S. Appl. No. 11/148,530.

Notice of Allowance of U.S. Appl. No. 11/215,951, mailed Apr. 25, 2007.

Office Action of U.S. Appl. No. 11/237,169 mailed Nov. 3, 2006.

Notice of Allowance of U.S. Appl. No. 11/237,169 mailed Mar. 26, 2007.

Akerman, "Toward a Universal Memory", Apr. 22, 2005, vol. 308, Science, 508-510.

Jan. 31, 2007 Reply to Nov. 3, 2006 Office Action of U.S. Appl. No. 11/237,169.

Examiner's Answer of U.S. Appl. No. 10/955,549 mailed Sep. 30, 2008.

Asuha, T. et al. "Ultrathin silicon dioxide layers with a low leakage current density formed by chemical oxidation of Si", Applied Physics Letters, vol. 81, No. 18 (Oct. 28, 2002), 3410-3412.

(56) References Cited

OTHER PUBLICATIONS

Babcock, J.A. ,et al., "Polysilicon Resistor Trimming for Packaged Integrated Circuits", IEDM 93 (1993),247-250.
Ellis, K. A. et al. "Phosphorus Diffusion in Silicon Oxide and Oxynitride Gate Dielectrics", Electrochem, Sol. St. Lett. 2, (1999), 516-518.
Feldbaumer, D.W. et al. "Theory and Application of Polysilicon Resistor Trimming", Solid-State Electronics, vol. 38 11, (1995), 1861-1869.
Hamada, T. et al., "Thin Inter-Polyoxide Films for Flash Memories Grown at Low Temperature (400°) by Oxygen Radicals", IEEE Elect. Dev. Lett. vol. 22, No. 9, (Sep. 2001), 423-425.
Mahan, J. E. , "Threshold and Memory Switching in Polycrystalline Silicon", Applied Physics Letter, 41, 5. (Sep. 1982) 479-481.
Malhotra et al., "Fundamentals of Memory Switching in Vertical Polycrystalline Silicon Structures", IEEE Transactions on Electron Devices, ED-32 (11), 2441, (1985).
Malhotra, Vinod.,et al., "An Electrothermal Model of Memory Switching in Vertical Polycrystalline Silicon Structures", IEEE Transactions on Electron Devices, vol. 35, 9, (Sep. 1988),1514-1523.
Nutzel, J.F., et al., "Comparison of P And Sb as n-dopants for Si molecular beam epitaxy", J. Appl. Phys. 78 (2), (Jul. 15, 1995), 937-940.
Park, B., et al., "Study of contact resistance in in-situ phosphorus layer doped Si deposition process", Electrochemical Society Proceedings 99-31, (1999), 34-45.
Raider, S. I. et al., "Abstract: Stoichiometry of SiO2/Si interfacial regions: I. Ultrathin oxide films", J. Vac. Sci. Tech. vol. 13, No. 1, (Jan./Feb. 1976), 58.
Office Action of U.S. Appl. No. 11/866,403 mailed Feb. 13, 2008.
Notice of Allowance of U.S. Appl. No. 11/866,403 mailed Aug. 14, 2008.
Notice of Allowance of U.S. Appl. No. 11/866,403 mailed Jan. 21, 2009.
Notice of Allowance of U.S. Appl. No. 11/866,403 mailed Apr. 22, 2009.
Jun. 13, 2008 Reply to Feb. 13, 2008 Office Action of U.S. Appl. No. 11/866,403.
Herner et al., U.S. Appl. No. 10/326,470, filed Dec. 19, 2002.
Office Action of U.S. Appl. No. 11/401,073 mailed Oct. 26, 2007.
Notice of Allowance of U.S. Appl. No. 11/401,073 mailed Sep. 23, 2008.
Notice of Allowance of U.S. Appl. No. 11/401,073 mailed Mar. 3, 2009.
Mar. 26, 2008 Reply to Oct. 26, 2007 Office Action of U.S. Appl. No. 11/401,073.
Dec. 1, 2008 Reply Brief of U.S. Appl. No. 10/955,549.
Jul. 3, 2008 Amended Appeal Brief of U.S. Appl. No. 10/955,549.
Jun. 4, 2008 Notification of Non-Compliant Appeal Brief of U.S. Appl. No. 10/955,549.
May 27, 2008 Appeal Brief of U.S. Appl. No. 10/955,549.
Apr. 17, 2007 Appeal Brief of U.S. Appl. No. 10/955,549.
Jun. 6, 2008 Pre-Brief Appeal Conference decision of U.S. Appl. No. 11/148,530.
Apr. 23, 2008 Pre-Appeal Brief Request for Review of U.S. Appl. No. 11/148,530.
Aug. 12, 2008 Reply to Jun. 12, 2008 Ex Parte Quayle Office Action of U.S. Appl. No. 11/401,073.
Ex Parte Quayle Office Action of U.S. Appl. No. 11/401,073 mailed Jun. 12, 2008.
Oct. 9, 2009 Office Action of related Chinese Application No. 200680027149.2.
Office Action of related U.S. Appl. No. 11/148,530 mailed Nov. 9, 2009.
Feb. 9, 2010 Reply to Nov. 9, 2009 Office Action of related U.S. Appl. No. 11/148,530.
Final Office Action of related U.S. Appl. No. 11/148,530 mailed Jun. 4, 2010.
Examiner's Interview Summary of related U.S. Appl. No. 11/148,530 mailed Aug. 2, 2010.
Aug. 31, 2010 Reply Jun. 4, 2010 Final Office Action and Interview Summary with Examiner of related U.S. Appl. No. 11/148,530.
Restriction Requirement of U.S. Appl. No. 12/477,216 mailed Sep. 8, 2010.
Sep. 24, 2010 Reply to Restriction Requirement of related U.S. Appl. No. 12/477,216 mailed Sep. 8, 2010.
Restriction Requirement of U.S. Appl. No. 12/481,684 mailed Oct. 18, 2010.
Nov. 2, 2010 Reply to Restriction Requirement of related U.S. Appl. No. 12/481,684 mailed Oct. 18, 2010.
Office Action of related U.S. Appl. No. 12/477,216 mailed Nov. 5, 2010.
Office Action of related U.S. Appl. No. 12/481,684 mailed Dec. 8, 2010.
Office Action of related U.S. Appl. No. 11/148,530 mailed Dec. 14, 2010.
Restriction Requirement of U.S. Appl. No. 11/015,824 mailed Sep. 14, 2006.
Oct. 11, 2006 Reply to Restriction Requirement of U.S. Appl. No. 11/015,824 mailed Sep. 14, 2006.
Restriction Requirement of related U.S. Appl. No. 11/148,530 mailed Feb. 1, 2007.
Mar. 1, 2007 Reply to Restriction Requirement of related U.S. Appl. No. 11/148,530 mailed Feb. 1, 2007.
Restriction Requirement of related U.S. Appl. No. 11/401,073 mailed Sep. 12, 2007.
Oct. 12, 2007 Reply to Restriction Requirement of related U.S. Appl. No. 11/401,073 mailed Sep. 12, 2007.
Restriction Requirement of U.S. Appl. No. 10/955,549 mailed Mar. 17, 2006.
Apr. 7, 2006 Reply to Restriction Requirement of U.S. Appl. No. 10/955,549 mailed Mar. 17, 2006.
Restriction Requirement of U.S. Appl. No. 10/955,549 mailed Apr. 27, 2006.
May 22, 2006 Reply to Restriction Requirement of U.S. Appl. No. 10/955,549 mailed Apr. 27, 2006.
Interview Summary of U.S. Appl. No. 10/955,549, filed Oct. 16, 2007.
Feb. 7, 2011 Reply and Terminal Disclaimer to Nov. 5, 2010 Office Action of related U.S. Appl. No. 12/477,216.
Mar. 8, 2011 Reply to Dec. 8, 2010 Office Action of related U.S. Appl. No. 12/481,684.
Notice of Allowance of related U.S. Appl. No. 12/477,216 mailed Mar. 16, 2011.
Interview Summary of related U.S. Appl. No. 11/148,530 mailed Mar. 22, 2011.
Notice of Allowance of related U.S. Appl. No. 12/481,684 mailed May 11, 2011.
Notice of Abandonment of related U.S. Appl. No. 11/148,530 mailed Jun. 23, 2011.
Restriction Requirement of related U.S. Appl. No. 13/195,518 mailed Nov. 7, 2011.
Notice of Allowance of related U.S. Appl. No. 13/074,509 mailed Nov. 25, 2011.
Dec. 5, 2011 Response to Nov. 7, 2011 Restriction Requirement of related U.S. Appl. No. 13/195,518.
Office Action of related U.S. Appl. No. 13/195,518 mailed Feb. 15, 2012.
Notice of Allowance of related U.S. Appl. No. 13/228,109 mailed Feb. 15, 2012.
Notice of Allowance of related U.S. Appl. No. 13/228,109 mailed Apr. 3, 2012.
Notice of Allowance of related U.S. Appl. No. 13/074,509 mailed Apr. 12, 2012.
Decision on Appeal of related U.S. Appl. No. 10/955,549 mailed Apr. 27, 2012.
May 14, 2012 Terminal Disclaimer and Response to Feb. 15, 2012 Office Action of related U.S. Appl. No. 13/195,518.
Jun. 22, 2012 RCE and Response to Sep. 24, 2007 Final Office Action of related U.S. Appl. No. 10/955,549.
Notice of Allowance of related U.S. Appl. No. 13/195,518 mailed Jul. 10, 2012.

(56) References Cited

OTHER PUBLICATIONS

Office Action of related U.S. Appl. No. 10/955,54 mailed Sep. 19, 2012.
Notice of Allowance of related U.S. Appl. No. 13/195,518 mailed Oct. 23, 2012.
Office Action of related U.S. Appl. No. 13/568,834 mailed Nov. 30, 2012.
Dec. 19, 2012 Reply to Sep. 19, 2012 Office Action of related U.S. Appl. No. 10/955,549.
Final Office Action of related U.S. Appl. No. 10/955,549 mailed Feb. 1, 2013.
Feb. 26, 2013 Response to Nov. 30, 2012 Office Action and Terminal Disclaimer of related U.S. Appl. No. 13/568,834.
Notice of Allowance of related U.S. Appl. No. 13/568,834 mailed Mar. 12, 2013.
May 1, 2013 Reply to Feb. 1, 2013 Final Office Action of related U.S. Appl. No. 10/955,549.
Advisory Action related to U.S. Appl. No. 10/955,549 mailed Jun. 6, 2013.
Office Action in related U.S. Appl. No. 13/925,917 mailed Aug. 19, 2013.
Notice of Allowance related to U.S. Appl. No. 10/955,549 mailed Sep. 16, 2013.
Nov. 19, 2013 Reply and Terminal Disclaimer to Aug. 19, 2013 Office Action in related U.S. Appl. No. 13/925,917.
Notice to File Corrected Application Papers related to U.S. Appl. No. 10/955,549, filed Nov. 25, 2013.
Dec. 10, 2013 Reply to Nov. 25, 2013 Notice to File Corrected Application Papers related to U.S. Appl. No. 10/955,549.
Notice of Allowance in related U.S. Appl. No. 13/925,917 mailed Jan. 6, 2014.
Notice of Allowance in related U.S. Appl. No. 13/776,193 mailed Jun. 12, 2014.
Notice of Allowance in related U.S. Appl. No. 13/776,193, mailed Oct. 8, 2014.

* cited by examiner

Embodiment of 6,946,719

NONVOLATILE MEMORY CELL WITHOUT A DIELECTRIC ANTIFUSE HAVING HIGH- AND LOW-IMPEDANCE STATES

RELATED APPLICATIONS

This application is a division of Herner et al., U.S. patent application Ser. No. 10/955,549, "Nonvolatile Memory Cell Without a Dielectric Antifuse Having High- and Low-Impedance States," filed Sep. 29, 2004, which is a continuation-in-part of Herner et al., U.S. patent application Ser. No. 10/855,784, "An Improved Method for Making High-Density Nonvolatile Memory," filed May 26, 2004, now U.S. Pat. No. 6,952,030, which is a continuation of Herner et al., U.S. patent application Ser. No. 10/326,470, "An Improved Method for Making High-Density Nonvolatile Memory," filed Dec. 19, 2002 (since abandoned) and hereinafter the '470 application, each of which is hereby incorporated by reference herein in its entirety.

This application is related to Herner et al., U.S. application Ser. No. 10/954,577, "Junction Diode Comprising Varying Semiconductor Compositions,", hereinafter the '577 application; to Herner et al., U.S. application Ser. No. 10/954,510, "Memory Cell Comprising a Semiconductor Junction Diode Crystallized Adjacent to a Silicide,", hereinafter the '510 application; and to Petti et al., U.S. application Ser. No. 10/955,387, "Fuse Memory Cell Comprising a Diode, the Diode Serving as the Fuse Element,"; all assigned to the assignee of the present invention, all filed on even date herewith and all hereby incorporated by reference in their entirety.

BACKGROUND OF THE INVENTION

The invention relates to a memory cell comprising a semiconductor pillar, the memory cell having a first high-impedance state and a second low-impedance state, corresponding to unprogrammed and programmed states.

Some devices, as in Herner et al., U.S. patent application Ser. No. 10/326,470, "An Improved Method for Making High Density Nonvolatile Memory," filed Dec. 19, 2002 and hereinafter the '470 application, which is hereby incorporated by reference, employ a vertically oriented semiconductor junction diode interposed between conductors, the diode separated from at least one of the conductors by a dielectric rupture antifuse, or having a dielectric rupture antifuse interposed between diode portions.

Other ways of constituting a three dimensional array of programmable memory cells can advantageously be pursued, however.

SUMMARY OF THE PREFERRED EMBODIMENTS

The present invention is defined by the following claims, and nothing in this section should be taken as a limitation on those claims. In general, the invention is directed to a memory cell comprising a semiconductor pillar, the memory cell having an unprogrammed high-impedance state and, after application of a programming voltage, a programmed low-impedance state.

A first aspect of the invention provides for a programmable memory cell comprising a first conductor extending in a first direction; a vertical pillar consisting essentially of semiconductor material and conductivity-enhancing dopants and having a top surface and a bottom surface; a second conductor above the first conductor extending in a second direction different from the first direction, wherein the vertical pillar is disposed between the first and second conductors and wherein the top surface and the bottom surface are in electrical contact with the first and second conductors, and wherein, before programming of the memory cell, an unprogrammed current flows between the conductors when a read voltage is applied and wherein, after programming of the memory cell, a programmed current flows between the conductors when the same read voltage is applied, wherein a difference between the unprogrammed and programmed currents is sufficient for an unprogrammed state and an programmed state of the memory cell to be reliably distinguishable.

A related aspect of the invention provides for an array of memory cells, the array comprising: a plurality of substantially parallel, substantially coplanar first conductors extending in a first direction; a plurality of vertically oriented semiconductor pillars above and in electrical contact with the first conductors, wherein the pillars do not comprise a dielectric layer formed by deposition or a thermal or plasma oxidation or nitridation process exceeding 100 degrees C.; and a plurality of substantially parallel, substantially coplanar second conductors extending in a second direction different from the first direction, the second conductors above and in electrical contact with the pillars, wherein the first and second conductors and the pillars form a level of programmable memory cells disposed above a substrate.

A preferred embodiment of the invention provides for a monolithic three dimensional memory array, the array comprising: a) a first memory level, the first memory level comprising: i) a plurality of substantially parallel first conductors formed above a monocrystalline substrate; ii) a plurality of first vertical pillars consisting essentially of semiconductor material and conductivity-enhancing dopants, the first pillars above and in electrical contact with the first conductors; and iii) a plurality of substantially parallel second conductors formed above the first pillars, the first pillars in electrical contact with the second conductors, wherein the first conductors, first pillars, and second conductors make up a first plurality of unprogrammed memory cells; and b) a second memory level monolithically formed above the first memory level.

Another aspect of the invention provides for a method for forming a memory cell, the method comprising forming a first elongate conductor having a top layer; forming a vertical polycrystalline or amorphous pillar, the pillar consisting essentially of semiconductor material and comprising both an n-doped and a p-doped region, the pillar formed over and in electrical contact with the first conductor; and forming a second conductor over the pillar, the second conductor having a bottom layer, wherein the pillar is in electrical contact with the second conductor, wherein the top layer of the first conductor does not comprise semiconductor material and wherein the bottom layer of the second conductor does not comprise semiconductor material.

Yet another preferred embodiment of the invention provides for a method for forming a memory cell, the method comprising: forming a first conductor having a top layer; forming a layer stack consisting essentially of doped semiconductor material; patterning and etching the layer stack to form a semiconductor pillar in electrical contact with the top layer of the first conductor; forming a second conductor over the pillar, the second conductor having a bottom layer, wherein the pillar is in electrical contact with the second conductor, wherein the top layer of the first conductor does not comprise semiconductor material and wherein the bottom layer of the second conductor does not comprise semiconductor material.

An aspect of the invention provides for a method for forming a memory array, the method comprising: forming a plurality of substantially parallel first conductors; depositing a layer stack consisting essentially of semiconductor material and conductivity-enhancing dopants; patterning and etching the layer stack of semiconductor material to form a plurality of first pillars, each first pillar in electrical contact with a first conductor; and forming second conductors above the first pillars, each first pillar in electrical contact with a second conductor, wherein the array so formed comprises programmable memory cells.

Another embodiment of the invention provides for a method for forming a monolithic three dimensional memory array, the method comprising: forming a plurality of substantially parallel first conductors extending in a first direction; forming a plurality of first amorphous or polycrystalline semiconductor pillars, wherein the first pillars do not comprise a deposited dielectric layer and wherein the step of forming the first pillars does not comprise a plasma or thermal oxidation or nitridation step performed at temperatures greater than about 100 degrees C., and wherein each first pillar is above and in electrical contact with one of the first conductors; forming a plurality of substantially parallel second conductors over the first pillars, the second conductors extending in a second direction different from the first direction, each first pillar in electrical contact with at least one second conductor; and forming a plurality of second semiconductor pillars, each second pillar above and in electrical contact with a second conductor.

Yet another aspect of the invention provides for a programmable memory cell comprising: a first conductor extending in a first direction; a vertical pillar consisting essentially of semiconductor material and conductivity-enhancing dopants and having a top surface and a bottom surface; a second conductor above the first conductor extending in a second direction different from the first direction, wherein the vertical pillar is disposed between the first and second conductors, and wherein, before programming of the memory cell, an unprogrammed current flows between the conductors when a read voltage is applied and wherein, after programming of the memory cell, a programmed current flows between the conductors when the same read voltage is applied, wherein a difference between the unprogrammed and programmed currents is sufficient for an unprogrammed state and an programmed state of the memory cell to be reliably distinguishable.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIG. 8a is a perspective view of memory levels not sharing conductors, while

FIG. 9a is a perspective view of memory levels sharing conductors, while

DETAILED DESCRIPTION OF THE PREFERRED EMBODIMENTS

A semiconductor junction diode, for example a p-n diode or a p-i-n diode, has been paired with a dielectric rupture antifuse to form a memory cell, for example in the monolithic three dimensional memory array described in the '470 application.

Figure 1:
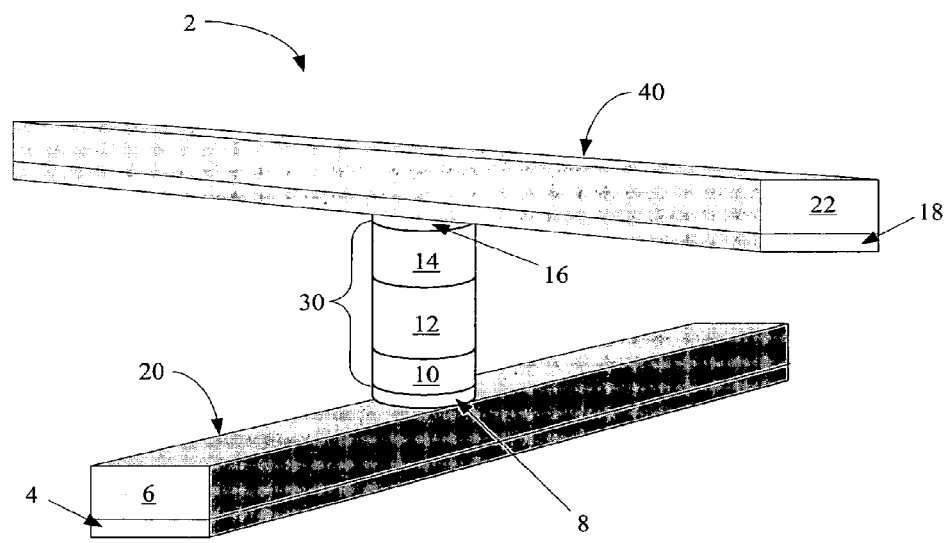
FIG. 1 is a perspective view of a memory cell comprising a vertically oriented junction diode and a dielectric rupture antifuse disposed between top and bottom conductors.

A preferred memory cell of the '470 application includes a vertically oriented junction diode disposed between conductors, the cell further having a dielectric rupture antifuse interposed between the junction diode and one of the conductors. A memory cell 2 according to the '470 application is shown in FIG. 1. A first conductor 20 preferably comprises titanium nitride layer 4 and tungsten layer 6. Junction diode 30 is formed on optional titanium nitride barrier layer 8 and comprises heavily doped semiconductor layer 10 of a first conductivity type, layer 12 which is undoped semiconductor material or lightly doped semiconductor material of a second conductivity type, and heavily doped semiconductor layer 14 of the second conductivity type. A thin silicon dioxide antifuse layer 16 is formed on top of the junction diode 30. Second conductor 40 preferably comprises titanium nitride layer 18 and tungsten layer 22.

The memory cell 2 is unprogrammed as formed. To program the cell, a voltage sufficient to cause dielectric breakdown of the antifuse material is applied across antifuse layer 16.

The term junction diode is used herein to refer to a semiconductor device with the property of conducting current more easily in one direction than the other, having two terminal electrodes, and made of semiconducting material which is p-type at one electrode and n-type at the other. Examples include p-n diodes and n-p diodes, which have p-type semiconductor material and n-type semiconductor material in contact, and p-i-n and n-i-p diodes, in which intrinsic (undoped) semiconductor material is interposed between p-type semiconductor material and n-type semiconductor material.

The cell of FIG. 1 is formed in an initial high-impedance state in which no or a very small level of current flows between the conductors when a read voltage is applied. After application of a programming voltage, the cell converts to a low-impedance state in which a significantly increased level of current flows between conductors upon application of the same read voltage. It has been assumed that the presence of the dielectric rupture antifuse prevented current flow in the unprogrammed cell, and that the change to lower impedance after programming was due largely or solely to dielectric breakdown of this dielectric rupture antifuse.

In embodiments of the present invention, however, the memory cell of embodiments of the '470 application has been modified by omitting the dielectric rupture antifuse. It has been found that the resulting memory cell exhibits the same behavior: As formed, the cell is in an initial high-impedance state with little or no current flow, and after application of a programming voltage, the cell is in a low-impedance state with significantly increased current flow.

Figure 2:
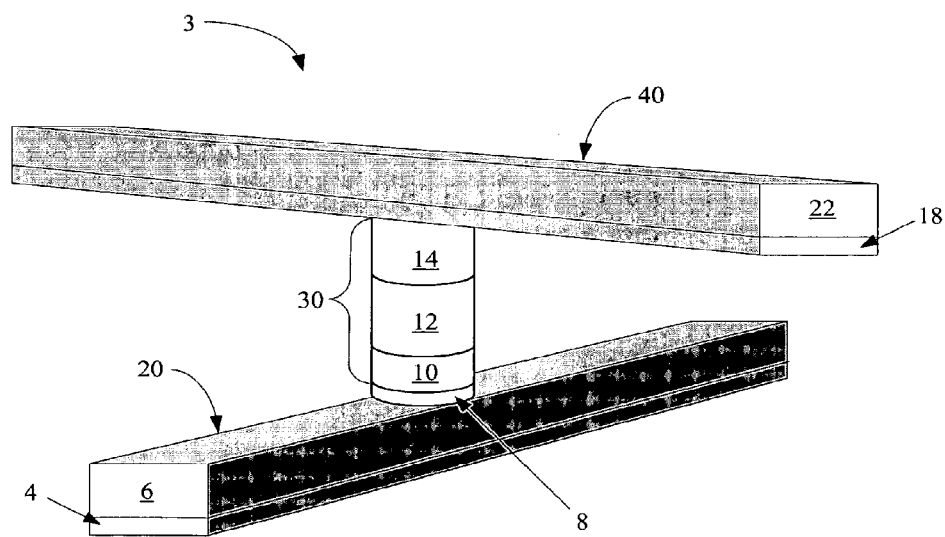
FIG. 2 is a perspective view of a memory cell comprising a vertically oriented junction diode having no dielectric rupture antifuse disposed between top and bottom conductors.

An example memory cell 3 formed according to the present invention is shown in FIG. 2. The first conductor 20 and junction diode 30 are preferably formed as the corresponding elements were formed in memory cell 2 of FIG. 1. No dielectric rupture antifuse is formed on junction diode 30, however; antifuse layer 16 of FIG. 1 is omitted. Second conductor 40 is formed on and in contact with junction diode 30.

Figure 3:
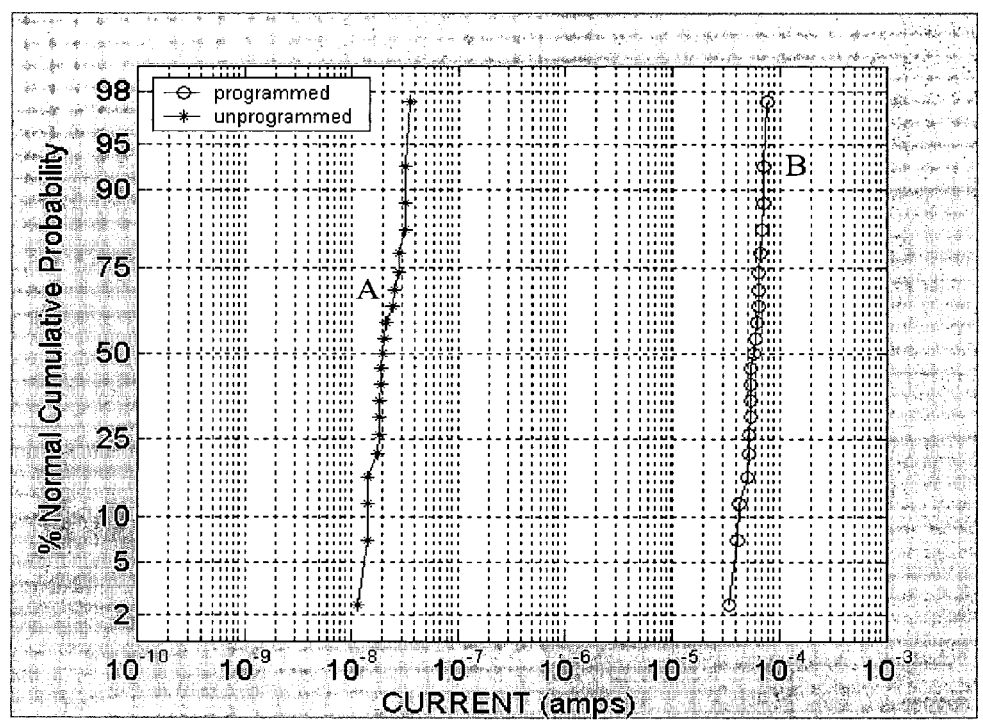
FIG. 3 is a probability plot showing unprogrammed and programmed current in memory cells like those of FIG. 2.

FIG. 3 is a probability plot showing current between conductors in memory cells like the cell shown in FIG. 2 before and after application of a programming voltage. In this example the diameter of junction diode 30 is about 0.15 micron. When a read voltage of 2.0 volts was applied between first conductor 20 and second conductor 40, the current flowing between conductors 20 and 40, shown on curve A, ranged between about $1 \times 10^{-8}$ amps and about $3.5 \times 10^{-8}$ amps; the median current was about $2 \times 10^{-8}$ amps. This is the unprogrammed or leakage current. After application of a programming pulse of about 8 volts between conductors 20 and 40, when the same read voltage is applied between first conductor 20 and second conductor 40, the current flowing between conductors 20 and 40, shown on curve B, ranged between about $3 \times 10^{-5}$ and about $8 \times 10^{-5}$ amps; the median current was about $6 \times 10^{-5}$ amps. This is the programmed or forward current.

In this example the difference between the programmed and unprogrammed current is more than three orders of magnitude. It is preferred for a memory cell for the difference between programmed and unprogrammed current to be at least two orders of magnitude. Such a difference allows programmed and unprogrammed state of the cell to be reliably distinguishable. Clearly a larger difference between the programmed and the unprogrammed current makes reliable sensing of the state of the cell easier.

It is also useful to consider current density flowing through the diode, the current flow per unit area of a cross-section of the diode. As noted, in this instance the diameter of junction diode 30 is about 0.15 micron. Due to etching effects, the sides of junction diode 30 tend to slope inward; thus the diameter at the top of junction diode 30 is about 0.1 micron, for an area of about $7.85 \times 10^{-3}$ micron. The current density at the top of the diode upon application of a read voltage of about 2.0 volts before programming is thus between about $1.3 \times 10^{-6}$ amp/micron$^2$ and about $4.4 \times 10^{-6}$ amp/micron$^2$ with a median of about $2.5 \times 10^{-6}$ amp/micron$^2$, while the current density at the top of the diode upon application of the same read voltage after programming is between about $3.8 \times 10^{-3}$ amp/micron$^2$ and about $1.0 \times 10^{-2}$ amp/micron$^2$, with a median of about $7.639 \times 10^{-3}$ amp/micron$^2$.

In the example of FIG. 2, junction diode 30 is formed of semiconductor material, typically polysilicon. Other semiconductor materials, for example germanium or silicon-germanium alloys, could be used instead. Specifically, the '577 application filed on even date herewith describes a junction diode formed having different semiconductor compositions in different parts of the diode. In preferred embodiments, for example, the junction diode comprises silicon and germanium; the bottom heavily doped region of a first conductivity type and the top heavily doped region of a second conductivity type each has a higher ratio of silicon to germanium than does the center lightly doped or intrinsic region. A diode according to the '577 application might advantageously be disposed between conductors without a dielectric antifuse and used as a memory cell according to the present invention.

In the embodiment described, the vertical semiconductor pillar has at least one region of a first conductivity type and at least one region of a second, opposite conductivity type, and functions as a junction diode. In other embodiments, the semiconductor pillar could have regions of a first conductivity type or of a second conductivity type only, but not both, and function as a resistor.

Aspects of the present invention provide for a semiconductor pillar disposed between a top and a bottom conductor wherein the portion of the top conductor and of the bottom conductor that actually contact the semiconductor pillar are not formed of semiconductor material. In the embodiment shown in FIG. 2, for example, the semiconductor pillar 30 contacts bottom conductor 20 at barrier layer 8 (which is preferably titanium nitride), and contacts top conductor 40 at adhesion layer 18 (also preferably titanium nitride.)

As described in the '470 application, titanium nitride barrier layer 8 can be patterned either with bottom conductor 20 or with junction diode 30. Which patterning step is used to shape barrier layer 8 has no apparent effect on device performance. Barrier layer 8 is formed of conductive material, is not formed of semiconductor material, is in physical and electrical contact with bottom conductor 20 and is electrically continuous with it; thus it will be considered to be part of bottom conductor 20.

Figure 4A:
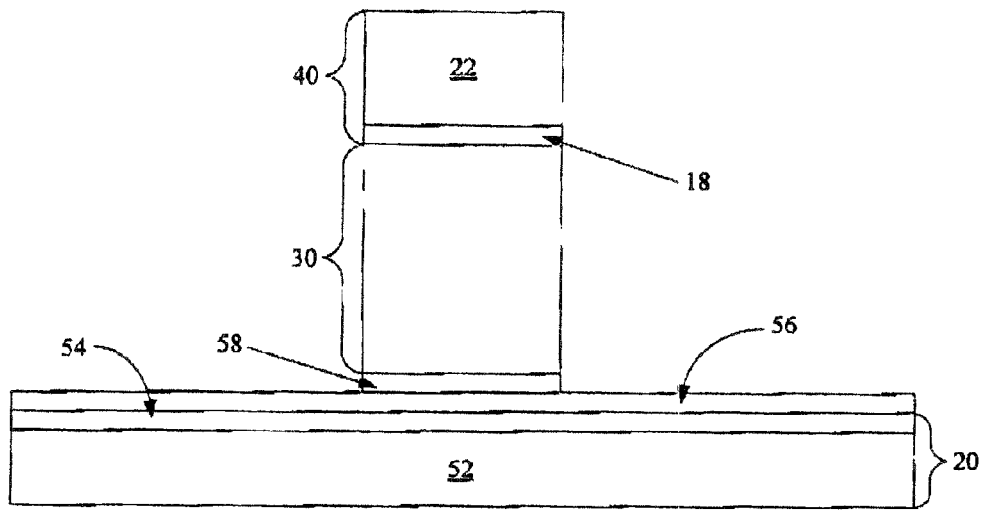
FIG. 4a is a cross-sectional view of fabrication of a prior art memory cell.

Petti et al., U.S. application Ser. No. 10/728,230, "Semiconductor Device Including Junction Diode Contacting Contact-Antifuse Unit Comprising Silicide," filed Dec. 3, 2003, hereby incorporated by reference and hereinafter the '230 application, includes an embodiment of a cell used in a monolithic three dimensional memory array; the cell is shown in FIG. 4a. In this embodiment, layer 52 of bottom conductor 20 is formed of polysilicon (in this discussion the term "polysilicon" will be used to describe polycrystalline silicon), then polysilicon layer 52 is patterned and etched to form substantially parallel rails, shown extending across the page from left to right. Dielectric material (not shown) is deposited between and over adjacent rails, and then the excess dielectric material removed to expose the tops of polysilicon rails 52, forming a planarized surface. Cobalt is deposited on polysilicon rails 52 and the intervening dielectric material, then annealed to react with underlying polysilicon layer 52, forming cobalt silicide layer 54 on the polysilicon only. The unreacted cobalt is removed, leaving cobalt silicide conductor 20. In the '230 application, a silicon dioxide antifuse layer 56 is grown on cobalt silicide layer 54. Barrier layer 58 is formed, preferably of titanium nitride. Polysilicon is deposited, then patterned and etched to form junction diode pillar 30. Top conductor 40 is formed of titanium nitride layer 18 and tungsten layer 22. Top conductor 40 is also formed in a rail shape and extends in a direction substantially perpendicular to the direction of bottom conductor 20, and thus is here shown in cross section.

Figure 4B:
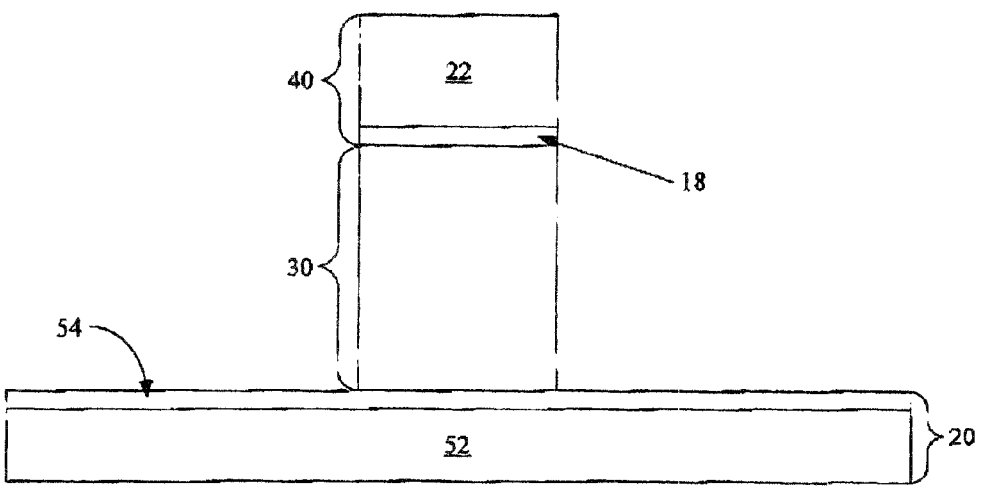
FIG. 4b is a cross-sectional view of fabrication of a memory cell formed according to an embodiment of the present invention.

A memory cell could be formed according to the present invention in which the embodiment of the '230 application shown in FIG. 4a is modified by omitting formation of antifuse layer 56. Such a cell is shown in FIG. 4b. As in the embodiment of FIG. 2, semiconductor pillar 30 contacts non-semiconductor material at both ends. Bottom conductor 20 comprises polysilicon layer 52, but the layer actually contacting the semiconductor pillar 30 is not semiconductor material, but rather titanium nitride layer 58. At its top end, semiconductor pillar 30 contacts titanium nitride layer 18 of top conductor 40. (For simplicity and consistency of description, polysilicon layer 52 and cobalt silicide layer 54 were together described as bottom conductor 20. In fact cobalt silicide layer 54 has much lower resistance than polysilicon layer 52, and actually serves as the conductor.) A memory array can be formed by forming a plurality of such cells, and a monolithic three dimensional memory array can be formed by stacking levels of such arrays by using the methods described in the '230 application, the '470 application, and the present application.

In the embodiments of the present invention so far described, the semiconductor pillar is disposed between top and bottom conductors, and is in electrical contact with both top and bottom conductors. For a pillar to be "in electrical contact" with a conductor means that no dielectric layer is disposed between it and the conductor. For example, in FIG. 4a of Petti et al., dielectric layer 56 is disposed between pillar 30 and titanium nitride layer 58 (which is in contact with and considered part of conductor 20); thus they are not in electrical contact. In FIG. 4b, in contrast, no dielectric layer intervenes, and pillar 30 is in electrical contact with conductor 20. Similarly, in memory cell 3 of FIG. 2, pillar 30 is in electrical contact with conductor 20, as no dielectric layer is disposed between them.

While not wishing to be bound by any particular theory, one possible mechanism for the change in impedance is that application of a programming voltage in some way changes the characteristics of the junction diode 30, which is typically formed of polycrystalline silicon, changing the resistance of the junction diode 30, which is a semiconductor pillar.

Similar phenomena have been reported by others. For example, Babcock et al., "Polysilicon Resistor Trimming for Packaged Integrated Circuits," IEDM Technical Digest, 1993, pp. 247-250, describe a change in resistance in polysilicon resistors induced by pulse current trimming. Malhotra et al., "An electrothermal model of memory switching in vertical polycrystalline silicon structures," IEEE Transactions on Electron Devices 33, p. 1514 (1988) explore a possible mechanism for a transition to a low resistance state in polysilicon. Babcock et al. further observe that after resistance of polysilicon resistors has been lowered by application of a programming pulse, recovery to slightly higher resistance can be achieved by applying a second current; this decrease and recovery of resistance is repeatable.

It is expected, then, that if the junction diode of the embodiments described so far is replaced with a resistor, the change in resistance may be reversible, allowing for a rewriteable memory cell.

A change in the characteristics of the semiconductor of the pillar is mentioned as one possible mechanism. Other mechanisms are also possible, however, and are not intended to be excluded.

To summarize, then, the aspect just described is a programmable memory cell comprising a first conductor extending in a first direction; a vertical pillar consisting essentially of semiconductor material and conductivity-enhancing dopants and having a top surface and a bottom surface; a second conductor above the first conductor extending in a second direction different from the first direction, wherein the vertical pillar is disposed between the first and second conductors and wherein the top surface and the bottom surface are in electrical contact with the first and second conductors, and wherein, before programming of the memory cell, an unprogrammed current flows between the conductors when a read voltage is applied and wherein, after programming of the memory cell, a programmed current flows between the conductors when the same read voltage is applied, wherein a difference between the unprogrammed and programmed currents is sufficient for an unprogrammed state and an programmed state of the memory cell to be reliably distinguishable.

Such a cell can be created by a method comprising forming a first elongate conductor having a top layer; forming a vertical polycrystalline or amorphous pillar, the pillar consisting essentially of semiconductor material and comprising both an n-doped and a p-doped region, the pillar formed over and in electrical contact with the first conductor; and forming a second conductor over the pillar, the second conductor having a bottom layer, wherein the pillar is in electrical contact with the second conductor, wherein the top layer of the first conductor does not comprise semiconductor material and wherein the bottom layer of the second conductor does not comprise semiconductor material.

In preferred embodiments, the pillar is formed by forming a layer stack consisting essentially of doped semiconductor material and patterning and etching the layer stack to form a semiconductor pillar in electrical contact with the top layer of the first conductor and in electrical contact with the second conductor.

It has been observed that a silicide in contact with the pillar seems to change the resistivity of the polysilicon. In one example, an array of memory cells was formed as in FIG. 2, with the difference that titanium nitride layer 18 was replaced with two layers: the lower layer was titanium, and the upper layer was titanium nitride. With subsequent thermal processing, the titanium of the lower layer reacted with heavily doped silicon layer 14 to form titanium silicide. The resulting diodes were found to be in a low-impedance state as formed, insufficiently distinguishable from the diodes of a programmed cell, rendering the array unusable as a memory in which a high-resistivity initial state is required.

In general, it is believed that when the semiconductor of the pillar is in immediate contact with a silicide, the resulting diode may be low-impedance as formed. While not wishing to be bound by any particular theory, it may be that formation of the silicide somehow changes the characteristics of the semiconductor of the pillar, rendering it low-impedance as formed. Herner et al., the '510 application, and Petti et al., both filed on even date herewith, teach memory arrays that use a low-impedance semiconductor pillar formed in contact with a silicide.

Programming and Sensing

This discussion has referred to read voltage and programming voltage. These terms will be described in more detail.

Figure 5:
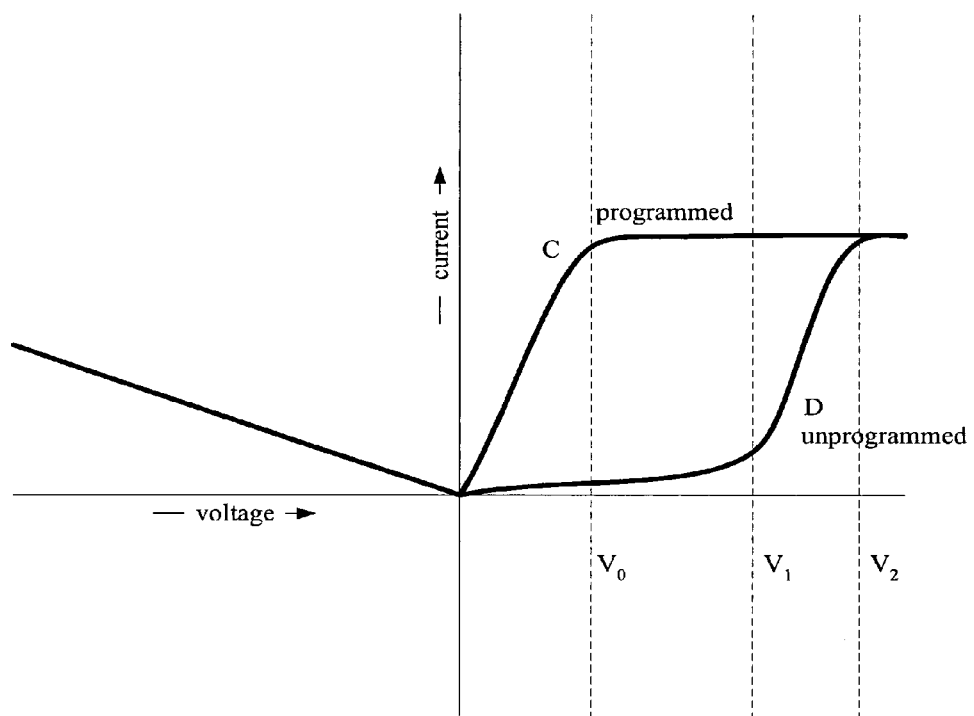
FIG. 5 is a graph showing current vs. voltage for a programmed and an unprogrammed memory cell.

FIG. 5 shows a plot of current vs. voltage (an I-V plot) for a diode formed according to the present invention. The y-axis (current) is logarithmic, while the x-axis is linear. Curve C shows current for a programmed cell and curve D shows current for an unprogrammed cell. It will be seen that between voltage $V_0$ and voltage $V_1$, the difference in current is at its maximum and thus most readily discernible. At voltages higher than $V_1$, some unprogrammed cells in an initial high-impedance state will be converted to a low-impedance, programmed state.

The shape of curve C is typical for the I-V curve of a programmed cell. At lower voltages (below $V_0$), a very small change in applied voltage results in a large change in current. At about $V_0$, an inflection point is reached, above which current changes only gradually with increasing voltage. The read voltage is best chosen to be at or above the voltage of this inflection point.

The read voltage should be large enough that the difference in programmed current and unprogrammed current is at least two one order of magnitude, preferably at least two orders of magnitude, most preferably at least three orders of magnitude.

A factor to consider in determining read voltage is that a cell may be read many times over the lifetime of the device. A typical requirement for device reliability is that a cell must retain a programmed or unprogrammed state for ten years of operating life. While a single application of a read voltage may not program a memory cell, the probability that a cell will inadvertently be programmed by repeated application of read voltage increases with the number of times the cell is read.

While a typical lifetime requirement for a memory in general is about ten years, the actual time that any single cell in the array is subject to a read voltage during ten years of operating life of the memory is, of course, very much shorter. In practice, the read voltage should be low enough that substantially no unprogrammed cells in the array will be programmed after about a million reads. In one particularly stringent example, a die was considered to have failed if fifteen out of 512 million cells were unintentionally programmed during three million reads. An acceptable industrial standard was for no more than fifty out of one million die to have this rate of failure.

For preferred embodiments of an array of memory cells formed according to the present invention, read voltage is between about 0.5 and about 4 volts, preferably between about 0.8 and about 3 volts, most preferably between about 1 and about 2 volts.

A programming voltage is ideally greater than $V_2$ in FIG. 5. Several factors must be considered when choosing programming voltage. The voltage must be sufficient to program substantially any cell in the array. The voltage must also be sufficient to program any cell in a reasonable period of time; in general a lower programming voltage takes longer to program a cell, while higher programming voltage programs a cell faster.

Higher programming voltage is not always better, however: It is generally advantageous for programming voltage to be no larger than that actually required to reliably program the devices, since the charge pumps required to create high voltages consume a large area in the substrate. High programming voltage also translates into high power consumption, a disadvantage for most consumer electronic devices. Very high voltages may actually damage or destroy cells. For a large number of memory cells, there will inevitably be some variation; some cells will program at a lower voltage, some at a higher voltage. Programming voltage must be sufficient to reliably program, or convert from a high-impedance, unprogrammed state to a low-impedance, programmed state, substantially any cell in an array of cells. Preferably, programming voltage should be sufficient to program substantially any unprogrammed cell in the array in no more than about two microseconds. Preferably programming time is no more than about one microsecond, preferably less than about 500 nanoseconds, most preferably less than about 350 nanoseconds.

For preferred embodiments of an array of memory cells formed according to the present invention, programming voltage will range between about 2 and about 18 volts, preferably between about 2.5 and about 8 volts, most preferably between about 3 and about 5 volts.

Fabrication

The '470 application described fabrication of a monolithic three dimensional memory array comprising memory cells like those of FIG. 1. The procedures described in that application, with omission of the step of forming the antifuse layer, can be used to fabricate a monolithic three dimensional memory array comprising memory cells like those of FIG. 2, formed according to the present invention. An overview of fabrication of a monolithic three dimensional memory array according to the present invention will be provided here. For clarity, not all of the details of the '470 application will be included, but it will be understood that no teaching of the '470 application, except for deliberate formation of the dielectric rupture antifuse, is intended to be excluded.

Figure 6A:
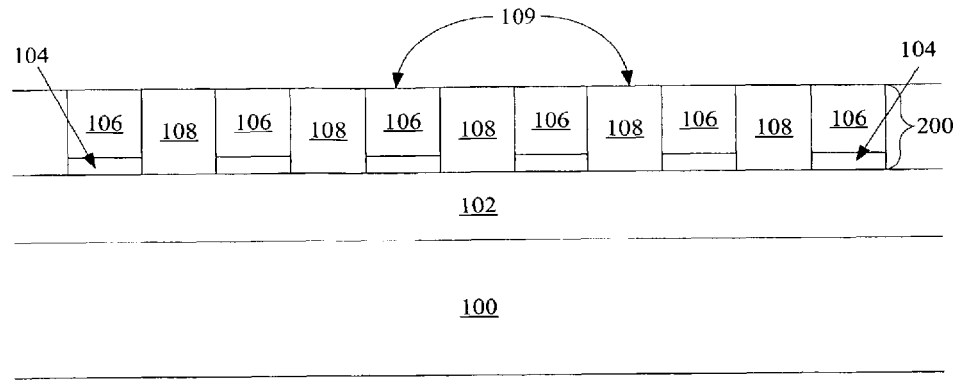
FIGS. 6a and 6b are cross-sectional views showing fabrication of an array of memory cells formed according to the present invention.

Turning to FIG. 6a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. Preferred materials for the adhesion layer 104 are tantalum nitride, tungsten nitride, titanium tungsten, sputtered tungsten, titanium nitride, or combinations of these materials. If the overlying conducting layer is tungsten, titanium nitride is preferred as an adhesion layer.

If adhesion layer 104 is included, it can be deposited by any process known in the art. Where adhesion layer 104 is titanium nitride, it can deposited by depositing a titanium nitride material, or by depositing titanium, which is then subject to a nitridation process. The titanium nitride can be deposited by any chemical vapor deposition (CVD) process, physical vapor deposition (PVD) process such as sputtering, or an atomic layer deposition (ALD) process. In one embodiment, the titanium nitride material is deposited by a sputtering process.

The thickness of adhesion layer 104 can range from about 20 to about 500 angstroms. In one embodiment, the thickness of adhesion layer 104 is about 200 angstroms. Note that in this discussion, "thickness" will denote vertical thickness, measured in a direction perpendicular to substrate 100.

The next layer to be deposited is conducting layer 106. Conducting layer 106 can comprise any conducting material known in the art, including tantalum, titanium, tungsten, copper, cobalt, or alloys thereof. Titanium nitride may be used. Where conducting layer 106 is tungsten, it can be deposited by any CVD process or a PVD process. In one embodiment, the tungsten is deposited by a CVD process. The thickness of conducting layer 106 can depend, in part, on the desired sheet resistance and therefore can be any thickness that provides the desired sheet resistance. In one embodiment, the thickness of conducting layer 106 can range from about 200 to about 2000 angstroms. In another embodiment, the thickness of conducting layer 106 is about 1500 angstroms.

If tungsten is used for conducting layer 106, it is preferred to use a barrier layer between the tungsten and the semiconductor material that will be part of the semiconductor pillars that will eventually overlie the conductors. Such a barrier layer serves to prevent reaction between tungsten and silicon. The barrier layer may either be patterned with the conductor rails or with the semiconductor pillars.

If a barrier layer is to be used, and is to be formed as the top layer of the conductor rails, the barrier layer should be deposited after the conducting layer 106. (The barrier layer is not shown in FIG. 6a.) Any material serving this function can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Once all the layers that will form the conductor rails have been deposited, the layers will be patterned and etched using any suitable masking and etching process to form substantially parallel, substantially coplanar conductors 200, shown in FIG. 6a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a liquid solvent such as EKC.

The width of conductor rails 200 after etch can range from about 300 to about 2500 angstroms. (In this discussion "width" will refer to the width of a line or feature measured in the plane substantially parallel to substrate 100.) The width of the gaps between conductor rails 200 preferably is substantially the same as the width of conductor rails 200 themselves, though it may be greater or less. In one embodiment, the width of conductor rails is about 1500 angstroms, as is the width of the intervening gaps.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as CVD, or, for example, high density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 6a. This removal of dielectric overfill to form planar surface 109 can be performed by any process known in the art, such as chemical mechanical planarization (CMP) or etchback. For example, the etchback techniques described in Raghuram et al., U.S. application Ser. No. 10/883,417, "Non-selective Unpatterned Etchback to Expose Buried Patterned Features," filed Jun. 30, 2004 and hereby incorporated by reference in its entirety, can advantageously be used.

Alternatively, conductor rails can be formed by a Damascene process, in which oxide is deposited, lines are etched in the oxide, then the lines are filled with titanium nitride and tungsten to create the conductor rails. The titanium nitride and tungsten films on top of the original plane of oxide are removed by any process known in the art, such as CMP or etchback, leaving titanium nitride and tungsten wires, with dielectric material insulating the wires from one another.

Figure 6B:
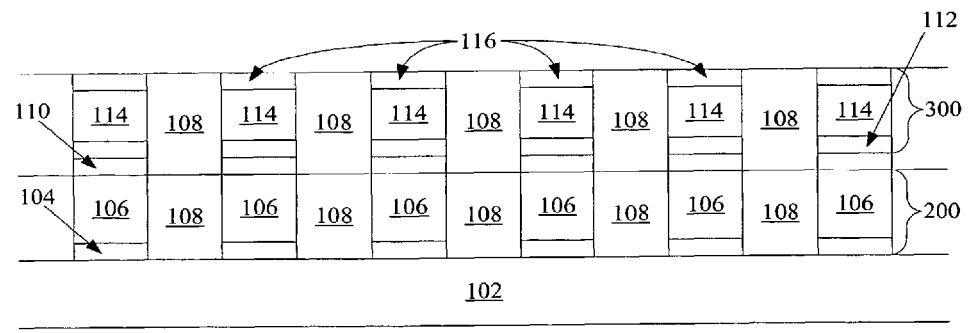

Next, turning to FIG. 6b, vertical semiconductor pillars will be formed above completed conductor rails 200. (To save space substrate 100 is omitted in FIG. 6b; its presence will be assumed.) If a barrier layer 110 is to be used between the lower conductor rails and the semiconductor elements, and has not yet been formed, it will be deposited as the first layer after planarization of the conductor rails. It can be of any of the materials and deposited in any of the manners described earlier. Its thickness can be, for example, about 20 to about 500 angstroms. The thickness of barrier layer 110 is preferably about 200 angstroms.

Next semiconductor material that will be patterned into pillars is deposited. The semiconductor material can be silicon, silicon-germanium, silicon-germanium-carbon, germanium, or other suitable IV-IV compounds, gallium arsenide, indium phosphide, or other suitable III-V compounds, zinc selinide, or other II-VI compounds, or a combination. Silicon is commonly used in the industry, so, for simplicity, this description will refer to the semiconductor material as silicon, but it will be understood that other materials may be substituted. In preferred embodiments, polysilicon is used.

Figure 7A:
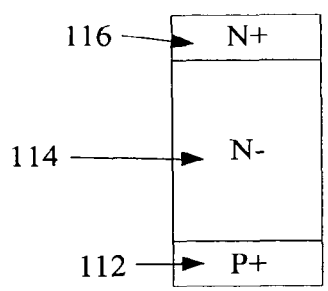
FIGS. 7a-7d are cross-sectional views showing preferred junction diodes for use in a memory cell.
Figure 7B:
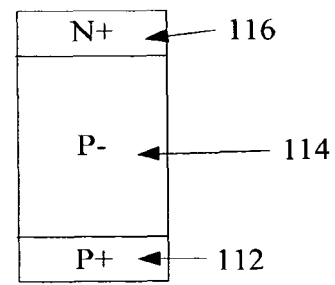
Figure 7C:
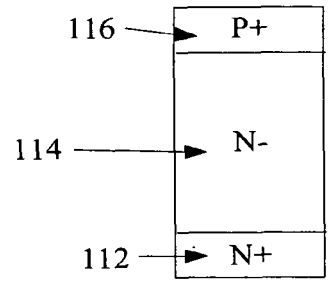
Figure 7D:
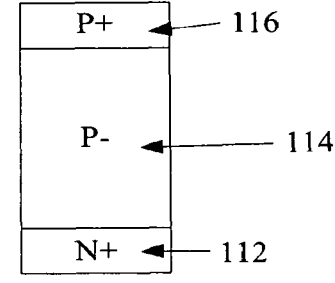

In preferred embodiments, the semiconductor pillar is a junction diode, comprising a bottom heavily doped region of a first conductivity type and a top heavily doped region of a second conductivity type. The middle region, between the top and bottom regions, is an intrinsic or lightly doped region of either the first or second conductivity type. FIGS. 7a-7d illustrate preferred permutations: In the diodes of FIGS. 7a and 7b, bottom 112 region is P+ (heavily doped p-type silicon), and top region 116 is N+. In the diodes of FIGS. 7c and 7d, bottom region 112 is N+ and top region 116 is P+. In FIGS. 7a and 7c, middle region 114 is N−, while in FIGS. 7b and 7d, middle region 114 is P−. The middle region can intentionally be lightly doped, or it can be intrinsic, or not intentionally doped. An undoped region will never be perfectly electrically neutral, and will always have defects or contaminants that cause it to behave as if slightly n-doped or p-doped.

To form, for example, the diode of FIG. 7a, a layer of heavily doped p-type silicon 112 must be formed. This layer can be formed by any deposition and doping method known in the art. The silicon can be deposited and then doped, but is preferably doped in situ by flowing a donor gas providing dopant atoms during deposition of the silicon. In a preferred embodiment, this layer can range from about 100 to about 1000 angstroms, preferably 200 angstroms, and have a dopant concentration of about $1\times10^{19}$ to about $2\times10^{21}$ atoms/cm$^3$, and preferably about $8\times10^{20}$ atoms/cm$^3$.

The next layer 114 will be slightly n-type silicon. This layer can formed by any deposition and doping method known in the art. The thickness of the lightly doped n-type silicon layer can range from about 1000 to about 4000 angstroms, preferably about 2500 angstroms, and have a dopant concentration of about $1\times10^{15}$ to about $1\times10^{18}$ atoms/cm$^3$, and preferably $1\times10^{15}$ atoms/cm$^3$. In one embodiment, silicon is deposited without intentional doping, yet has defects which render it slightly n-type.

Above this is a layer 116 of heavily doped n-type silicon. The thickness of the heavily doped n-type silicon can range from about 100 to about 2000 angstroms, preferably about 800 angstroms. Note this is the thickness after the device is complete. Some portion of the top of this layer will be consumed in a subsequent CMP or etchback step, and will thus be thinner in the finished device then as-deposited. In general, about 800 angstroms of silicon will be removed by the planarizing step; thus an extra thickness of 800 angstroms of silicon should be deposited. This layer has a dopant concentration of about $2\times10^{19}$ to about $4\times10^{21}$ atoms/cm$^3$, preferably about $8\times10^{20}$ atoms/cm$^3$. It can be doped in situ or by ion implantation. Preferably this layer is doped by ion implantation.

Returning to FIG. 6b, semiconductor layers 116, 114 and 112 just deposited will be patterned and etched to form semiconductor pillars 300. If barrier layer 110 was not patterned with the bottom conductor rails, it will be patterned with the pillars. Semiconductor pillars 300 should have about the same pitch and about the same width as conductors 200 below, such that each semiconductor pillar 300 is formed on top of a conductor 200. Some misalignment can be tolerated.

The semiconductor pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

The semiconductor pillars so far described form junction diodes, and each comprises a heavily doped n-type region and a heavily doped p-type region. In alternative embodiments, however, the semiconductor pillars could be formed as resistors, having either n-type regions or p-type regions, but not both. Bottom, middle, and top regions of a resistor, for example, may be P+, P−, and P+, respectively, or N+, N−, and N+, respectively.

The semiconductor pillars of the present invention are vertical pillars consisting essentially of semiconductor material and conductivity-enhancing dopants. As described earlier, the semiconductor material is preferably silicon, germanium, or alloys thereof, and different compositions of semiconductors may be found in different regions of the pillar. Conductivity-enhancing dopants are p-type and n-type dopants, conventionally used to increase the conductivity of silicon; p-type dopants include boron and aluminum, while n-type dopants include phosphorus and arsenic. The pillars do not include a dielectric layer formed by deposition or thermal or plasma oxidation. It will be understood that the pillars may include contaminants which will unavoidably be present in a production environment, so long as these contaminants do not materially affect the basic properties of the pillar; i.e. its behavior as a junction diode or a resistor.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material. The silicon dioxide can be deposited using any known process, such as CVD, or, for example, HDPCVD.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. For example, the etchback techniques described in Raghuram et al. can be used. The resulting structure is shown in FIG. 6b. If heavily doped top regions 116 are to be doped using ion implantation, implantation should be performed at this point.

Overlying conductors can be formed in the same manner as the underlying conductors. The overlying conductors will extend in a different direction from the first conductors, preferably substantially perpendicular to them. The resulting structure is a bottom or first story of memory cells.

To summarize, what has just been constructed is an array of memory cells, the array comprising: a plurality of substantially parallel, substantially coplanar first conductors extending in a first direction; a plurality of vertically oriented semiconductor pillars above and in electrical contact with the first conductors, wherein the pillars do not comprise a dielectric layer formed by deposition or a thermal or plasma oxidation or nitridation process exceeding 100 degrees C.; and a plurality of substantially parallel, substantially coplanar second conductors extending in a second direction different from the first direction, the second conductors above and in electrical contact with the pillars, wherein the first and second conductors and the pillars form a level of programmable memory cells disposed above a substrate.

Specifically, this array can be created by a method comprising forming a plurality of substantially parallel first conductors; depositing a layer stack consisting essentially of semiconductor material and conductivity-enhancing dopants; patterning and etching the layer stack of semiconductor material to form a plurality of first pillars, each first pillar in electrical contact with a first conductor; and forming second conductors above the first pillars, each first pillar in electrical contact with a second conductor, wherein the array so formed comprises programmable memory cells.

Figure 8A:
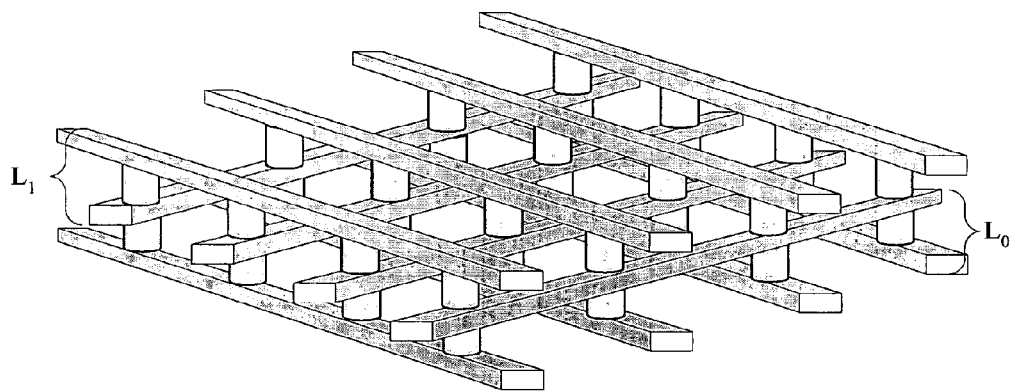
Figure 8B:
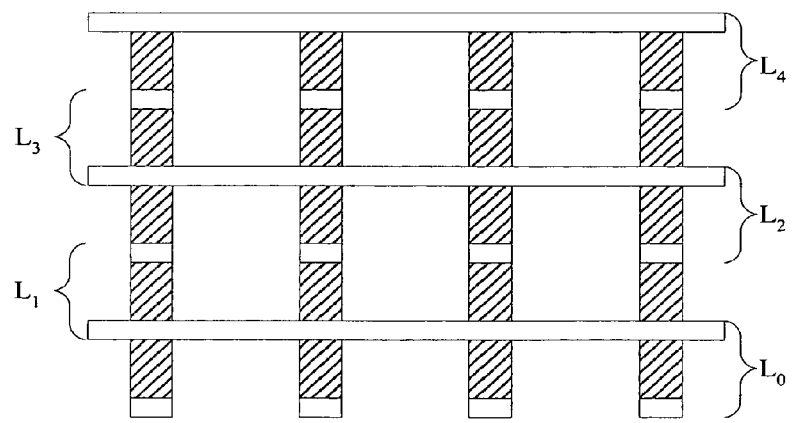
FIG. 8b is a cross-sectional view.

By continuing to form semiconductor pillars and conductors, further memory cells can be built above this first story. Specifically, a second level of pillars can be formed on the second conductors, then third conductors (preferably extending in substantially the same direction as the first conductors) formed on the second pillars. As shown in FIG. 8a, the upper conductors of the lower story of cells $L_0$ will serve as the lower conductors of an overlying, second story of cells $L_1$. FIG. 8b is a cross-sectional view of the same memory array, showing additional levels $L_2$ through $L_4$ formed by continuing to form levels of pillars and conductors, the conductors shared between levels.

Figure 9A:
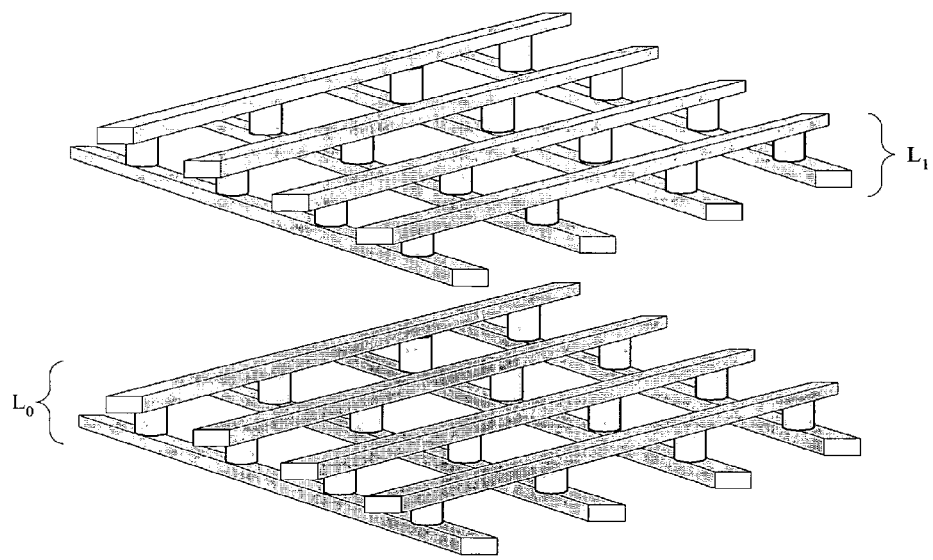
Figure 9B:
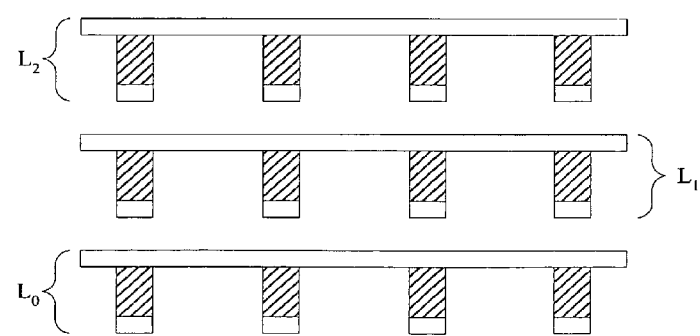
FIG. 9b is a cross-sectional view.

Alternatively, the first and second memory levels can be separated by dielectric and not share a level of conductors, as shown in FIG. 9a. The vertical distance between the first level $L_0$ and the second level $L_1$ is exaggerated for clarity. FIG. 9b is a cross-sectional view, showing additional level $L_2$ formed by continuing to form levels of pillars and conductors, the conductors not shared between levels.

Ultimately the memory can be several stories high. In a preferred embodiment, the memory can contain from two to twelve stories. In another preferred embodiment, the memory contains eight stories. Formation of the memory array just described differed from that of the memory array described in the '470 application in the omission of a step to form a dielectric rupture antifuse, either deposited or grown by flowing an oxygen- or nitrogen-containing gas at elevated temperature, for example over 100 degrees C. The memory cell does not include an explicitly formed dielectric rupture antifuse sufficient to affect operation of the memory cell. Note that during processing, a native oxide may spontaneously form at some point in the structure of a memory array formed according to the present invention. For example, during formation of the memory array just described, a CMP step may be performed to remove dielectric overfill and expose the tops of the semiconductor pillars. In preferred embodiments, the next step may be ion implantation to dope the top regions of the pillars, followed by deposition of the titanium nitride adhesion layer of the conductors to be formed atop them. Each of these steps is formed in a different tool. While wafers are transferred from one tool to the next they are exposed to air, and a native oxide will form on the exposed tops of the semiconductor pillars. This native oxide is insufficient to operate as an effective dielectric rupture antifuse, and a memory array including such an incidentally formed native oxide falls within the scope of the present invention. Preferred embodiments have been described in which the memory cell is formed having no dielectric antifuse, or having a dielectric layer which is not formed by a deliberate deposition or oxidation step. In other embodiments of the present invention, however, it may be desirable to include an intentionally formed dielectric antifuse layer as described in the '470 application. To program such a memory cell, the dielectric antifuse layer must be ruptured and the semiconductor material of the pillar must be converted from a high-impedance state in which it is formed to a low-impedance state.

Such a programmable memory cell comprises a first conductor extending in a first direction; a vertical pillar consisting essentially of semiconductor material and conductivity-enhancing dopants and having a top surface and a bottom surface; a second conductor above the first conductor extending in a second direction different from the first direction, wherein the vertical pillar is disposed between the first and second conductors, and wherein, before programming of the memory cell, an unprogrammed current flows between the conductors when a read voltage is applied and wherein, after programming of the memory cell, a programmed current flows between the conductors when the same read voltage is applied, wherein a difference between the unprogrammed and programmed currents is sufficient for an unprogrammed state and an programmed state of the memory cell to be reliably distinguishable. In preferred embodiments the semiconductor pillar is not in contact with a silicide.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Herner, U.S. application Ser. No. 10/095,962, "Silicide-Silicon Oxide-Semiconductor Antifuse Device and Method of Making," filed Mar. 13, 2002; Vyvoda et al., U.S. patent application Ser. No. 10/185,507, "Electrically Isolated Pillars in Active Devices," filed Jun. 27, 2002; Vyvoda, U.S. patent application Ser. No. 10/440,882, "Rail Schottky Device and Method of Making", filed May 19, 2003; and Cleeves et al., "Optimization of Critical Dimensions and Pitch of Patterned Features in and Above a Substrate," U.S patent application Ser. No. 10/728,451, filed Dec. 5, 2003, all assigned to the assignee of the present invention and hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The present invention has been described herein in the context of a monolithic three dimensional memory array formed above a substrate. Such an array comprises at least a first memory level formed at a first height above the substrate and a second memory level formed at a second height different from the first height. Three, four, eight, or more memory levels can be formed above the substrate in such a multilevel array.

As appropriate, the methods and devices of the present invention can be used in any of the monolithic three dimensional memory arrays described in any of the incorporated references, including the '470 and the '230 applications.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed:

1. A programmable memory cell comprising:
a first conductor extending in a first direction;
a vertical pillar consisting essentially of semiconductor material and conductivity-enhancing dopants and having a top surface and a bottom surface; and
a second conductor above the first conductor extending in a second direction different from the first direction, wherein:
the vertical pillar is disposed between the first and second conductors,
the top surface and the bottom surface are in electrical contact with the first and second conductors,
the vertical pillar comprises a silicon-germanium alloy and has a bottom region and a center region, the bottom region having a higher ratio of silicon to germanium than the center region,
no dielectric rupture antifuse is disposed between the first and second conductors, and
the programmable memory cell has a high impedance state and conducts unprogrammed current during application of a read voltage and has a low impedance state and conducts programmed current after application of a programming voltage and then the read voltage.

2. The memory cell of claim 1 wherein the vertical pillar functions as a junction diode.

3. The memory cell of claim 2 wherein the vertical pillar comprises a heavily doped p-type region and a heavily doped n-type region.

4. The memory cell of claim 1 wherein the vertical pillar comprises doped regions of one conductivity type only.

5. The memory cell of claim 4 wherein the vertical pillar functions as a resistor.

6. The memory cell of claim 1 wherein the read voltage is between about 0.5 volts and about 4 volts.

7. The memory cell of claim 6 wherein the read voltage is between about 0.8 volts and about 3 volts.

8. The memory cell of claim 1 wherein the read voltage is between about 1 volt and about 2 volts.

9. The memory cell of claim 1 wherein the memory cell is programmed by application of the programming voltage, the programming voltage between about 2 volts and about 18 volts.

10. The memory cell of claim 9 wherein the memory cell is programmed by application of the programming voltage, the programming voltage between about 2.5 volts and about 8 volts.

11. The memory cell of claim 10 wherein the memory cell is programmed by application of the programming voltage, the programming voltage between about 3 volts and about 5 volts.

12. The memory cell of claim 1 wherein the first or the second conductor does not comprise semiconductor material.

13. The memory cell of claim 12 wherein the first or the second conductor comprises a metal.

14. The memory cell of claim 13 wherein the first or the second conductor comprises tungsten.

15. The memory cell of claim 1 wherein the difference between the unprogrammed current and the programmed current is at least two orders of magnitude.

16. The memory cell of claim 15 wherein the difference between the unprogrammed current and the programmed current is at least three orders of magnitude.

17. The memory cell of claim 1 wherein the unprogrammed current is less than or equal to about $3.5 \times 10^{-8}$ amps.

18. The memory cell of claim 1 wherein the unprogrammed current density is less than or equal to about $4.4 \times 10^{-6}$ amp/micron2.

19. The memory cell of claim 1 wherein the programmed current is more than or equal to about $3 \times 10^{-5}$ amps.

20. The memory cell of claim 1 wherein the programmed current density is more than or equal to about $3.82 \times 10^{-3}$ amp/micron2.

21. The memory cell of claim 1 wherein the semiconductor material is not in contact with a silicide.

* * * * *